US007663909B2

(12) United States Patent
Philipp et al.

(10) Patent No.: US 7,663,909 B2
(45) Date of Patent: Feb. 16, 2010

(54) INTEGRATED CIRCUIT HAVING A PHASE CHANGE MEMORY CELL INCLUDING A NARROW ACTIVE REGION WIDTH

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 416 days.

(21) Appl. No.: 11/483,873

(22) Filed: Jul. 10, 2006

(65) Prior Publication Data

US 2008/0006811 A1    Jan. 10, 2008

(51) Int. Cl.
*G11C 11/00*    (2006.01)
(52) U.S. Cl. .............. 365/163; 365/148; 365/225.7; 365/227; 365/226; 365/51; 365/63
(58) Field of Classification Search ........... 365/163, 365/148, 51, 63, 100, 225.7, 227, 226
See application file for complete search history.

(56) References Cited

FOREIGN PATENT DOCUMENTS

KR    10-2006-0079455    *  7/2006

OTHER PUBLICATIONS

Hwang, Cheol Seong, KR 10-2006-0079455, published Jul. 6, 2006, Machine Translation, pp. 1-64.*
S.L. Cho et al., "Highly Scalable On-Axis Confined Cell Structure for High Density PRAM beyond 256Mb", 2005 Symposium on VLSI Technology, 2 pgs. (2005).
Lai et al., "OUM—A 180nm Nonvolatile Memory Cell Element Technology For Stand Alone and Embedded Applications", IEDM 2001.
Lai et al., "Current Status of the phase change memory and its future", IEDM, 4 pgs (2003).
Y.H. Ha et al., "An Edge Contact Type Cell for Phase Change RAM Featureing very Low Power Consumption",VLSI, 2 pgs. 2003.
Hori, H. et al., "A Novel Cell Technology Using N-doped GeSbTe Films for Phase Change RAM", 2003 Symposium on VLSI Technology, 2 pgs. (2003).
Hwang et al., "Full Integration and Reliability Evaluation of Phase-change RAM", Symposium on VLSI Teachnology Digest of Technical Papers, 2 pgs. (2003).
Geong et al., "Switching Current Scaling and Reliability Evaluation in Pram", NVSMW, 2004.
Pellizzer et al., Novel Trench Phase-Change Memory Cell for Embedded and Stand-Alone Non-Volatile Memory Applications, VLSI, 2 pgs. (2004).
English Translation of Korean Office Action mailed Apr. 28, 2008 for Korean Application No. 10-2007-0069304, Low Power Phase Change Memory Cell Having Different Phase Change Materials.

\* cited by examiner

*Primary Examiner*—Andrew Q Tran
(74) *Attorney, Agent, or Firm*—Dicke, Billig & Czaja, PLLC (57) ABSTRACT

A memory cell includes a first electrode and an opposing second electrode, and a memory stack between the first and second electrodes. The memory stack includes a first layer of thermal isolation material contacting the first electrode, a second layer of thermal isolation material contacting the second electrode, and a phase change material between the first layer of thermal isolation material and the second layer of thermal isolation material. In this regard, the phase change material defines an active region width that is less than a width of either of the first layer of thermal isolation material and the second layer of thermal isolation material.

5 Claims, 9 Drawing Sheets

INTEGRATED CIRCUIT HAVING A PHASE CHANGE MEMORY CELL INCLUDING A NARROW ACTIVE REGION WIDTH

BACKGROUND

Semiconductor memories provide memory storage for electronic devices and have become very popular in the electronic products industry. In general, many semiconductor chips are typically fabricated (or built) on a silicon wafer. The semiconductor chips are individually separated from the wafer for subsequent use as memory in electronic devices. In this regard, the semiconductor chips contain an array of memory cells that are configured to store retrievable data, often characterized by the logic values of 0 and 1.

One class of semiconductor memories is resistive memories. They typically use two or more different resistive values of a switchable resistor to define cell states in the memory useful in storing data. One particular type of resistive memory is a phase change memory. In one known structure of a phase change memory cell, the memory cell is formed at the intersection of a phase change memory material and an electrode. Passing energy of an appropriate value through the electrode heats the phase change memory cell, thus affecting a phase/state change in its atomic structure. The phase change memory cell can be selectively switched between logic states 0 and 1, for example, and/or selectively switched between multiple logic states.

Materials that exhibit the above-noted phase change memory characteristics include elements of Group VI of the periodic table (such as Tellurium and Selenium) and their alloys, referred to as chalcogenides or chalcogenic materials. Other non-chalcogenide materials also exhibit phase change memory characteristics.

The atomic structure of one type of phase change memory cell can be switched between an amorphous state and one or more crystalline states. The amorphous state has greater electrical resistance than the crystalline state(s), and typically includes a disordered atomic structure with only short range coordination. In contrast, the crystalline states each generally have a more ordered atomic structure, and lower electrical resistance (and higher the electrical conductivity).

The atomic structure of a phase change material becomes more ordered when maintained at (or slightly above) the crystallization temperature. A subsequent slow cooling of the material results in a stable orientation of the atomic structure in the highly ordered (crystalline) state. To switch back, or reset to the amorphous state, for example in the chalcogenide material, the local temperature is generally raised above the melting temperature (approximately 600 degrees Celsius) to achieve a highly random atomic structure, and then rapidly cooled to "lock" the atomic structure in the amorphous state.

The temperature-induced set/rest changes in the memory cell(s) create locally elevated temperatures, or hot spots, within each cell. Hot spots in memory cells require an increase in current (and thus power) to reset a memory state in the memory cell. It is desired to reduce the power needed to change memory states in memory cells to enable the use of smaller selection devices, thus reducing an overall size for memory devices, in general.

For these and other reasons, there is a need for the present invention.

SUMMARY

One aspect of the present invention provides a memory cell that includes a first electrode and an opposing second electrode, and a memory stack between the first and second electrodes. The memory stack includes a first layer of thermal isolation material contacting the first electrode, a second layer of thermal isolation material contacting the second electrode, and a phase change material between the first layer of thermal isolation material and the second layer of thermal isolation material. In this regard, the phase change material defines an active region width that is less than a width of either of the first layer of thermal isolation material and the second layer of thermal isolation material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
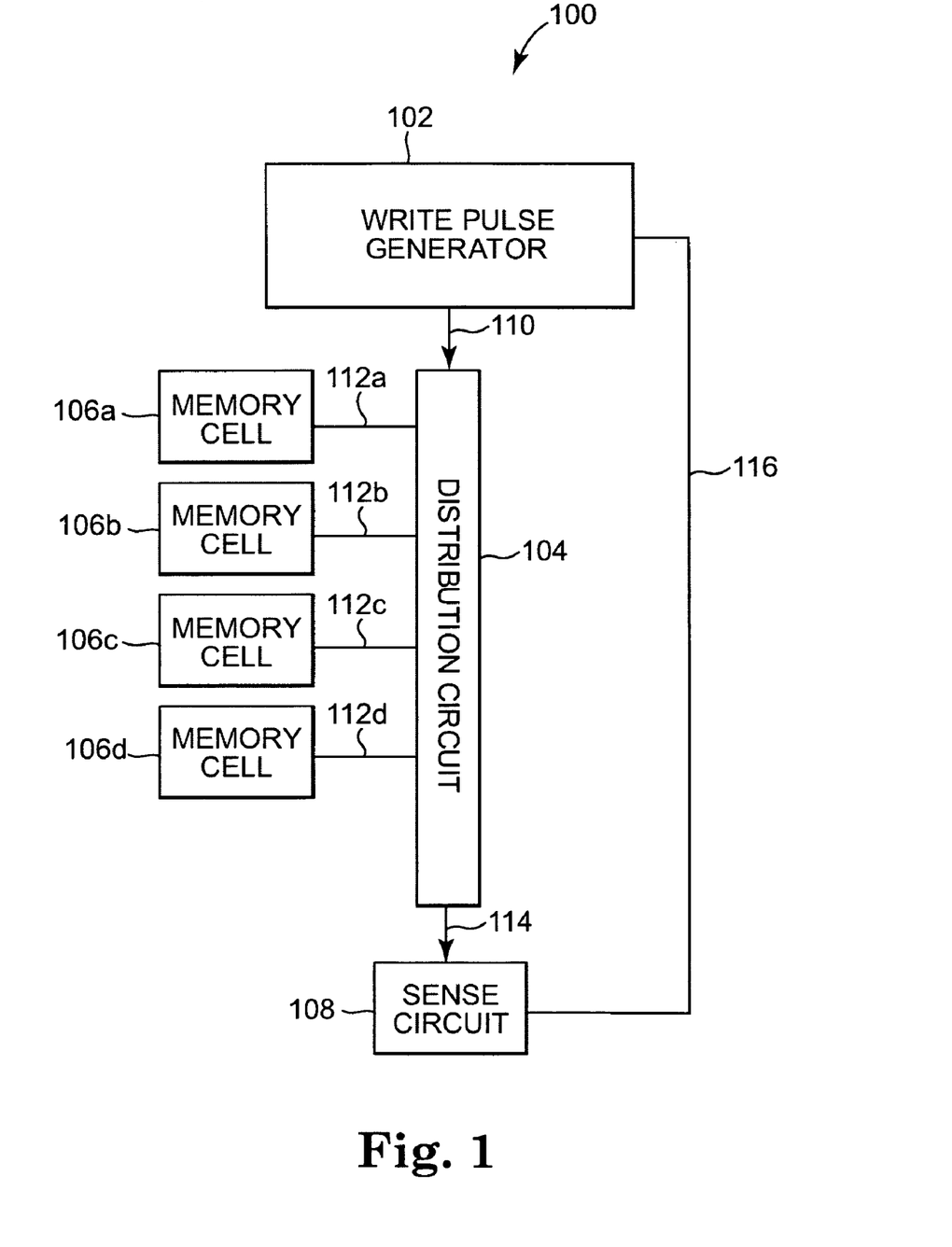
FIG. 1 illustrates a simplified block diagram of a memory device including memory cells according to one embodiment of the present invention.

FIG. 1 illustrates a simplified block diagram of a memory device 100 according to one embodiment of the present invention. Memory device 100 includes a write pulse generator 102, a distribution circuit 104, memory cells 106a, 106b, 106c, and 106d, and a sense circuit 108. In one embodiment, memory cells 106a-106d are phase change memory cells that beneficially employ an amorphous to crystalline phase transition of memory material within the cell for storing data in the memory. Write pulse generator 102 is electrically coupled to distribution circuit 104 through signal path 110. Distribution circuit 104 is electrically coupled to memory cells 106a-106d through signal paths 112a-112d, respectively, and to sense circuit 108 through signal path 114. Write pulse generator 102 is electrically coupled to sense circuit 108 through a signal path 116. Each of the memory cells 106a-106d can be programmed into a memory state associated with a particular resistance value, and the resistance value is controlled using a suitable electrical write strategy.

As used herein the term "electrically coupled" is not meant to mean that the elements must be directly coupled together, and intervening elements may be provided between the "electrically coupled" elements.

In one embodiment, each phase change memory cell 106a-106d includes phase change material providing a data storage location. The active region for the phase change memory cell is where the phase change material transitions between the crystalline state and the amorphous state for storing one bit, 1.5 bits, two bits, or several bits of data.

In one embodiment, write pulse generator 102 generates current or voltage pulses that are controllably directed to memory cells 106a-106d via distribution circuit 104. In one embodiment, distribution circuit 104 includes a plurality of transistors that controllably direct current or voltage pulses to the memory cells.

In one embodiment, memory cells 106a-106d include a phase change material that can be changed from an amorphous state to a crystalline state, or from a crystalline state to an amorphous state, under influence of a temperature change. These crystalline memory states are useful for storing data in memory device 100. The memory state(s) can be assigned to the bit values, such as bit values "0" and "1." The bit states of memory cells 106a-106d differ significantly in their electrical resistivity. In the amorphous state, a phase change material exhibits significantly higher resistivity than in the crystalline state. In this manner, sense amplifier 108 reads the cell resistance such that the bit value assigned to a particular memory cell 106a-106d is determined.

To program one of the memory cells 106a-106d within memory device 100, write pulse generator 102 generates a current or voltage pulse for heating the phase change material in the target memory cell. In one embodiment, write pulse generator 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell heats the phase change material of the target memory cell above its crystallization temperature (but below its melting temperature) long enough to achieve the crystalline state. Generally, a "reset" operation of a memory cell heats the phase change material of the target memory cell above its melting temperature, and then quickly quenches/cools the material, thereby achieving the amorphous state.

Aspects of the present invention provide a memory cell stack including multiple layers of, for example, phase change materials having a variation in etch rates. A selective control of a thickness of each layer in the stack, in combination with the variation in the etch rate between the layers in the stack, enable a precise control of the geometry, size, and shape of the stack by controlled undercut etching of portions of the stack. Controlled undercut etching of different phase change materials within the stack provide memory cells having a suitably narrow current path through the stack that draw less power in changing memory states in the memory cells, which enables the use of smaller selection devices, and thus reduces an overall size for memory devices.

FIGS. 2-11 illustrate various embodiments of a low power memory cell having an active region that locates large memory changing temperature gradients away from the opposing electrodes to provide improved memory cell lifetime and endurance. In general, a stack of phase change material is provided between opposing electrodes that defines an active region width that is less than a width of either of a first phase change material and a second phase change material of the stack. The resulting phase change memory cells draw less power in changing memory states in the memory cells, which enables the use of smaller selection devices, and thus reduces an overall size for memory devices. The low power phase change memory cells generally include memory elements that have been fabricated by a controlled undercut etching of different phase change materials within the memory element.

Figure 2:
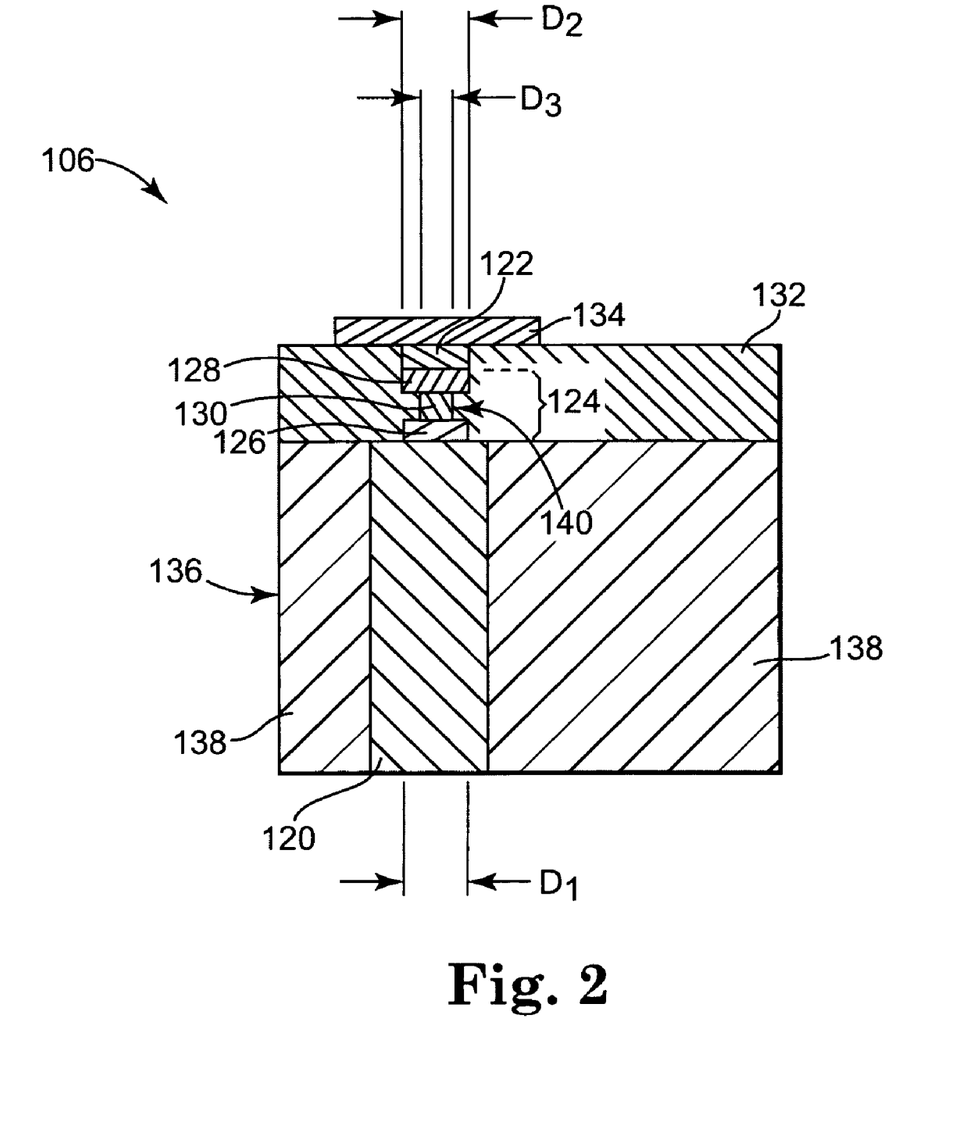
FIG. 2 illustrates a cross-sectional view of a memory cell according to one embodiment of the present invention.

FIG. 2 illustrates a cross-sectional view of a memory cell 106 according to one embodiment of the present invention. In one embodiment, memory cell 106 includes a first electrode 120, an opposing second electrode 122, and a stack 124 of phase change materials extending between first electrode 120 and second electrode 122. In one embodiment, an additional conducting layer (not shown, but see, for example, layer 220 in FIG. 12) is provided between first electrode 120 and stack 124. The interface formed between the additional conducting layer and stack 124 is, in one embodiment, an in-situ interface.

In one embodiment, stack 124 of phase change materials includes a first insulating layer 126 contacting first electrode 120, a second insulating layer 128 contacting second electrode 122, and a phase change material 130 between first insulating layer 126 and second insulating layer 128, where layers 126, 128 can include phase change material and phase change material 130 is selected to have a higher electrical resistivity than either of layers 126, 128. In one embodiment, layers 126, 128 include phase change materials such that stack 124 of phase change materials includes a first phase change material 126 contacting first electrode 120, a second phase change material 128 contacting second electrode 122, and a third phase change material 130 between first phase change material 126 and second phase change material 128. In another embodiment, stack 124 includes a continuous gradient of phase change materials, as best illustrated in FIG. 19.

Isolation material 132 surrounds stack 124 of phase change material and second electrode 122. In one embodiment, isolation material 132 is an insulation dielectric and includes, for example, silicon dioxide ($SiO_2$), a porous oxide insulator, a low-k insulation material, or other suitable insulation materials.

Figure 3:
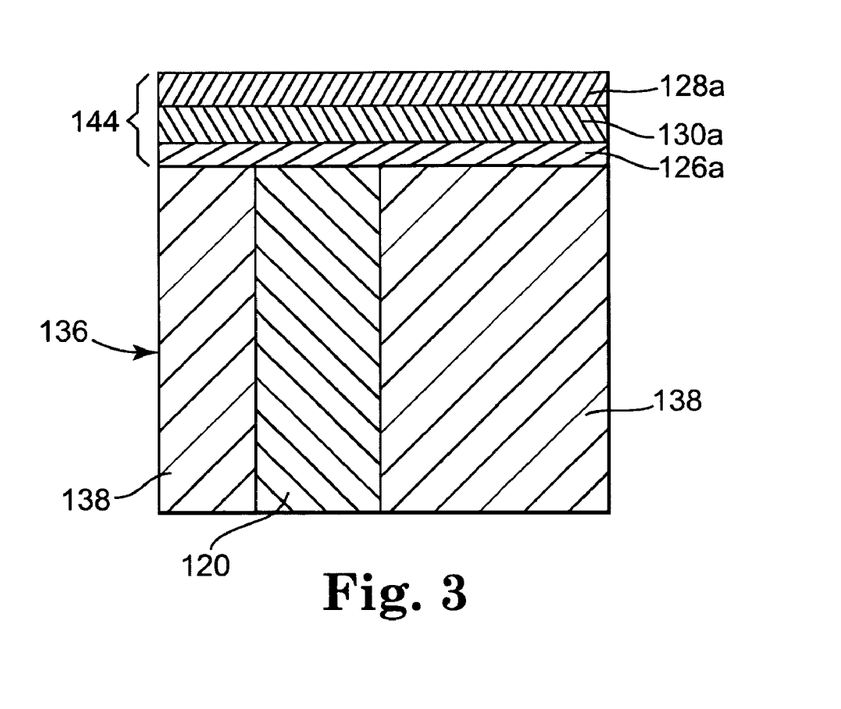
FIG. 3 illustrates a cross-sectional view of a stack of phase change materials disposed on a pre-processed wafer according to one embodiment of the present invention.

In one embodiment, a plug landing pad 134 is subsequently coupled to memory cell 106 to enable electrical connectivity of memory cell 106 to distribution circuit 104 (FIG. 1), for example. In one embodiment, plug landing pad 134 is a metal pad that includes titanium nitride (TiN), tungsten (W), tantalum nitride (TaN), a copper pad, or a pad of other suitable electrode material. In one embodiment, memory cell 106 is fabricated directly onto an electrode plug 120 provided as a component of a pre-processed wafer 136, as best illustrated in FIGS. 3A and 3B. In one embodiment, pre-processed wafer 136 includes electrode plug 120 disposed within a dielectric field 138.

In one embodiment, stack 124 of phase change material defines an active region 140 that has a width D3 that is less than either a width D1 of first phase change material 126 or a width D2 of second phase change material 128. In particular, third phase change material 130 defines an active region width D3 that is less than either a width D1 of first phase change material 126 or a width D2 of second phase change material 128.

Active region 140 provides a reduced power/current consumption for memory cell 106. Active region 140 defines width D3 that is less than widths D1 and D2, such that the largest temperature gradient within cell 106 will occur in active region 140. Thus, active region 140 locates this region of largest temperature gradient within cell 106 away from electrodes 120, 122, resulting in improved memory lifetime and endurance.

In one embodiment, width D3 is less than width D1, and width D1 is less than width D2. In another embodiment, width D3 is less than width D2, and width D2 is less than width D1. In general, widths D1 and D2 are between about 10-100 nm, and width D3 is less than widths D1 and D2, where width D3 is between about 5-50 nm.

First electrode 120 and second electrode 122 include titanium nitride (TiN), tantalum nitride (TaN), tungsten (W), or other suitable electrode material. In one embodiment, electrode plug 120 is a TiN plug, a tungsten plug, a copper plug, or a plug of other suitable electrode material. In one embodiment, plugs 120, 122 include a stack of different materials, such as a stack that includes TiN disposed on W.

In one embodiment, each of phase change materials 126, 128, and 130 includes chalcogenide alloys having one or more elements from Group VI of the periodic table, such as Tellurium and/or Selenium and/or Sulfur, and their alloys. In one embodiment, at least one of phase change materials 126, 128, and 130 includes chalcogenide alloys having one or more elements from Group VI of the periodic table, such as Tellurium and/or Selenium and/or Sulfur, and their alloys. In another embodiment, one or more of phase change materials 126, 128, and 130 is chalcogen-free, i.e., is a phase change material that does not contain Tellurium, Selenium, or Sulfur, or alloys of Tellurium, Selenium, or Sulfur. Suitable materials for stack 124 of phase change material include, for example, compounds of GeSbTe, SbTe, GeTe, AgInSbTe, GeSb, GaSb, InSb, GeGaInSb.

In other embodiments, stack 124 includes one or more of the elements Ge, Sb, Te, Ga, As, In, Se, and S. In another embodiment, stack 124 includes a continuous gradient of the above-identified phase change materials. In addition, one or more of phase change materials 126, 128, and 130 may be selectively doped with nitrogen, oxygen, silicon, or other suitable materials.

Figure 8:
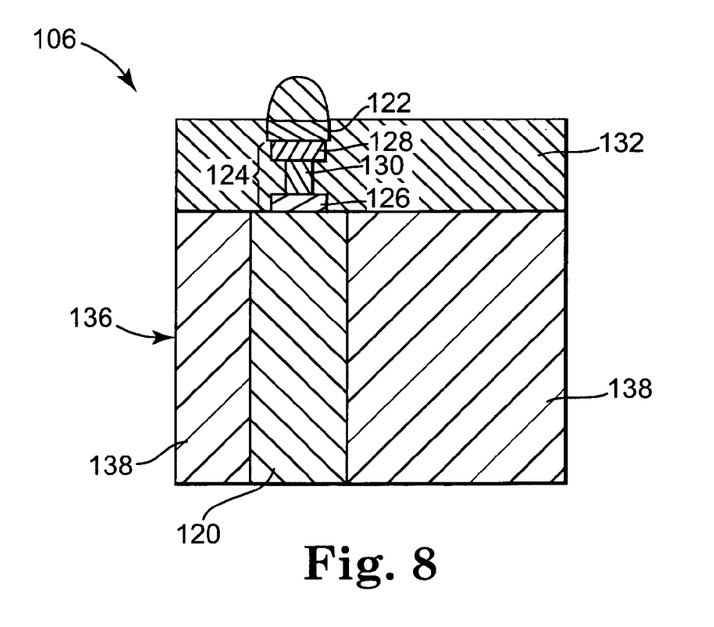
FIG. 8 illustrates a cross-sectional view of an isolation material surrounding a stack of phase change materials according to one embodiment of the present invention.

Stack 124 of phase change material includes third phase change material 130 disposed between first phase change material 126 and second phase change material 128. In general, and as best illustrated in FIG. 8, third phase change material 130 defines an etch rate relative to a reactive etch chemistry that is greater than an etch rate of either first phase change material 126 or second change material 128 relative to the same reactive etch chemistry.

For example, in one embodiment third phase change material 130 has an etch rate of between about 5 nm/h and about 30 nm/h for a given etchant. In one embodiment, the given etchant has an alkaline pH of about 11, and the third phase change material 130 has an etch rate of about 20 nm/h, and first phase change material 126 and second change material 128 have an etch rate of less than 5 nm/h. Consequently, during etching by the given etchant, third phase change material 130 is etched to a greater extent than first phase change material 126 or second phase change material 128. In this manner, third phase change material 130 is reduced to a width D3 that is less than a width D1 of first phase change material 126, or a width D2 of second phase change material 128.

In one embodiment, first phase change material 126 is different from second phase change material 128, and second phase change material 128 is different from third phase change material 130. In another embodiment, first phase change material 126 is substantially the same as second phase change material 128, and third phase change material 130 is different than first phase change material 126.

In general, it is desired that third phase change material 130 has an electrical resistivity that is greater than an electrical resistivity of first phase change material 126 and an electrical resistivity of second phase change material 128.

In general, crystalline phase change materials have greater etch rates than amorphous phase change materials. In this regard, it is desired that third phase change material 130, that otherwise defines active region 140, have a crystallization temperature that is different than a crystallization temperature of first phase change material 126 and a crystallization temperature of second phase change material 128. Preferably, third phase change material 130 has a lower crystallization temperature than first phase change material 126 and second phase change material 128, such that during an annealing process, third phase change material 130 is annealed to define an increased level of crystallization. In this manner, when annealed, third phase change material 130 will have an etch rate that is greater than an etch rate for first and second phase change materials 126, 128.

FIGS. 3-10 illustrate various embodiments related to the fabrication of a low power memory cell having an active region that locates large memory changing temperature gradients away from the opposing electrodes to provide improved memory cell lifetime and endurance. In general, a stack of material is provided including multiple layers of, for example, phase change materials having a variation in etch rates. A selective control of a thickness of each layer in the stack, in combination with the variation in the etch rate between the layers in the stack, enable a precise control of the geometry, size, and shape of the stack by controlled undercut etching of portions of the stack. Controlled undercut etching of different phase change materials within the stack provide memory cells having a suitably narrow current path through the stack that draw less power in changing memory states in the memory cells, which enables the use of smaller selection devices, and thus reduces an overall size for memory devices.

FIG. 3 illustrates a cross-sectional view of a stack 144 of phase change materials disposed on pre-processed wafer 136 according to one embodiment of the present invention. Stack 144 includes a first layer 126a of phase change material in contact with first electrode 120, a second layer 128a of phase change material, and a third layer 130a of phase change material extending between first layer 126a of phase change material and second layer 128a of phase change material.

In one embodiment, first layer 126a of phase change material is deposited using chemical vapor deposition (CVD), atomic layer deposition (ALD), metal organic chemical vapor deposition (MOCVD), plasma vapor deposition (PVD), jet vapor deposition (JVD), or other suitable depositions techniques.

In one embodiment, third layer 130a of phase change material is deposited onto first layer 126a of phase change material using a deposition technique of CVD, ALD, MOCVD, PVD, JVD, or other suitable deposition techniques.

In one embodiment, second layer 128a of phase change material is deposited onto third layer 130a of phase change material using a deposition technique of CVD, ALD, MOCVD, PVD, JVD, or other suitable deposition techniques.

Figure 4:
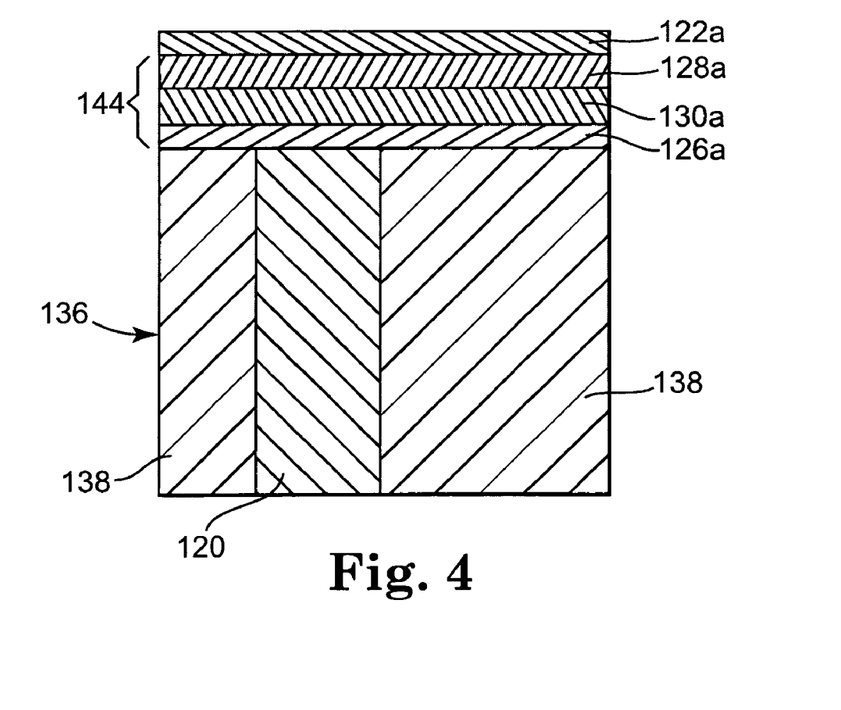
FIG. 4 illustrates a cross-sectional view of an electrode layer deposited onto a stack of phase change materials according to one embodiment of the present invention.

FIG. 4 illustrates a cross-sectional view of an electrode layer 122a deposited onto stack 144 of phase change materials according to one embodiment of the present invention. In one embodiment, electrode layer 122a is deposited onto second layer 128a of phase change material using a deposition technique of CVD, ALD, MOCVD, PVD, JVD, or other suitable deposition techniques.

Figure 5:
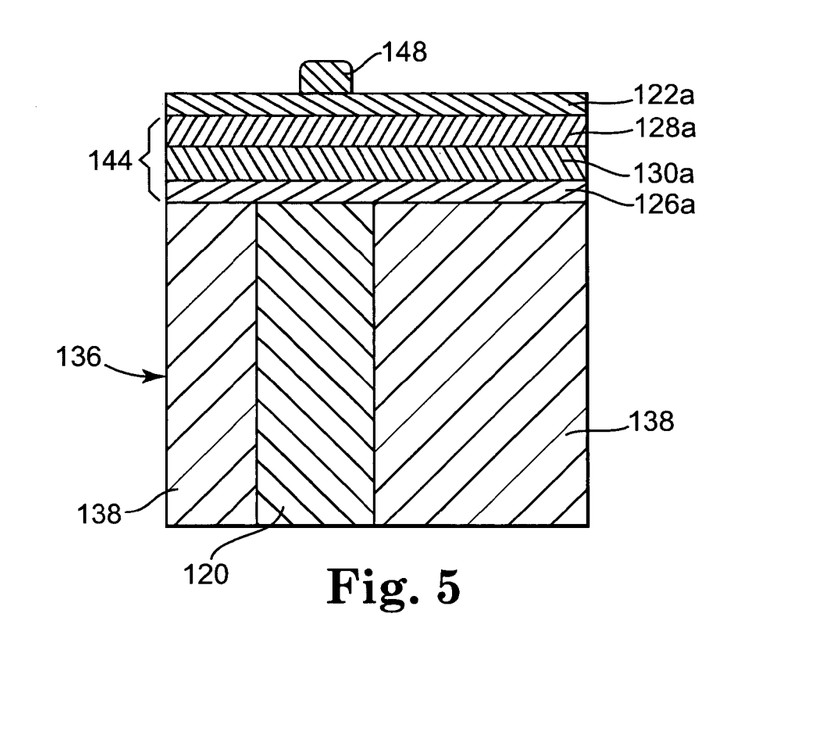
FIG. 5 illustrates a cross-sectional view of a resist and a mask deposited onto an electrode layer of a memory cell according to one embodiment of the present invention.

FIG. 5 illustrates a cross-sectional view of a mask layer 148 deposited onto an electrode layer 122a according to one embodiment of the present invention. In one embodiment, mask layer 148 is a photoresist/arc combination that is coated onto electrode layer 122a. Photoresist/arc combination is stripped after a pillar dry etch, for example, or stripped after a pullback etch.

In another embodiment, mask layer 148 is a hardmask deposited onto electrode layer 122a and includes a silicon nitride, for example, deposited by a suitable deposition technique, such as CVD, ALD, MOCVD, PVD, and/or JVD. In one embodiment, mask layer 148 is a stop etch layer including silicon nitride, such as SiN, or SiON, or other suitable stop etch materials. In this regard, hard mask layer 148 can be removed, or planarized, in a suitable mechanical process, such as a chemical mechanical polish/planarization process without prior stripping processes. In one embodiment, mask layer 148 is selected to define a width of one of or both first phase change material 126 and second phase change material 128 (FIG. 2).

Figure 6:
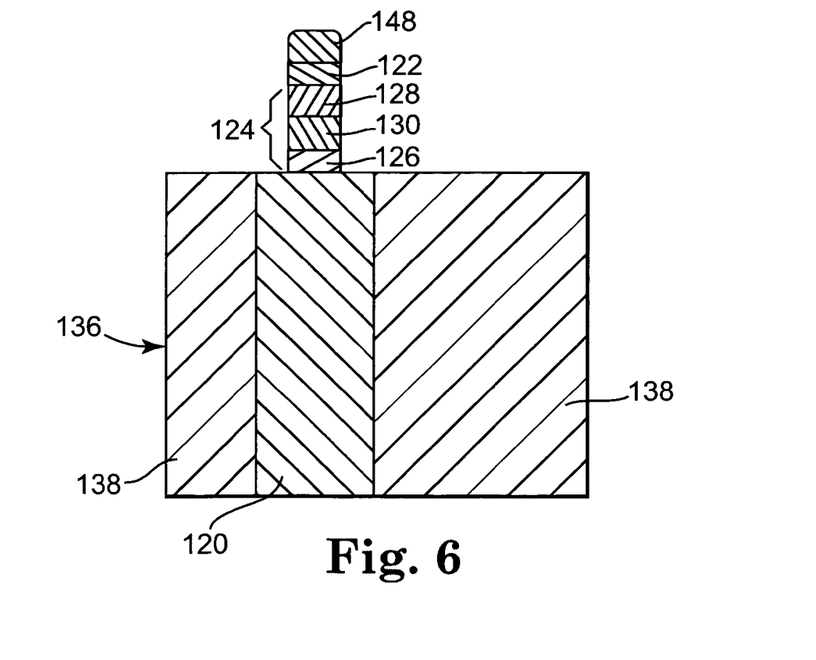
FIG. 6 illustrates a cross-sectional view of a stack of phase change materials after a dry etch according to one embodiment of the present invention.

FIG. 6 illustrates a cross-sectional view after a dry etch of stack 144 of phase change materials (FIG. 5) according to one embodiment of the present invention. In one embodiment, a dry etch of electrode layer 122a and stack 144 (FIG. 5) is initiated to define a pillar having a stack 124 of phase change materials. Stack 124 of phase change materials includes first 126, second 128, and third 130 phase change materials each having an approximately equal width defined by a width of mask layer 148.

In one embodiment, stack 124 of phase change materials is annealed to selectively crystallize one or more of the phase change materials 126, 128, and 130. In one embodiment, third phase change material 130 is selected to have a lower crystallization temperature than first phase change material 126 and second phase change material 128, such that after annealing, third phase change material 130 has an increased level of crystallization. The selective increase in the crystallization of third phase change material 130 predisposes third phase change material 130 to have an etch rate relative to a reactive etch chemistry that is greater than an etch rate of either of the first phase change material 126 and the second phase change material 128 relative to the same reactive etch chemistry.

Figure 7:
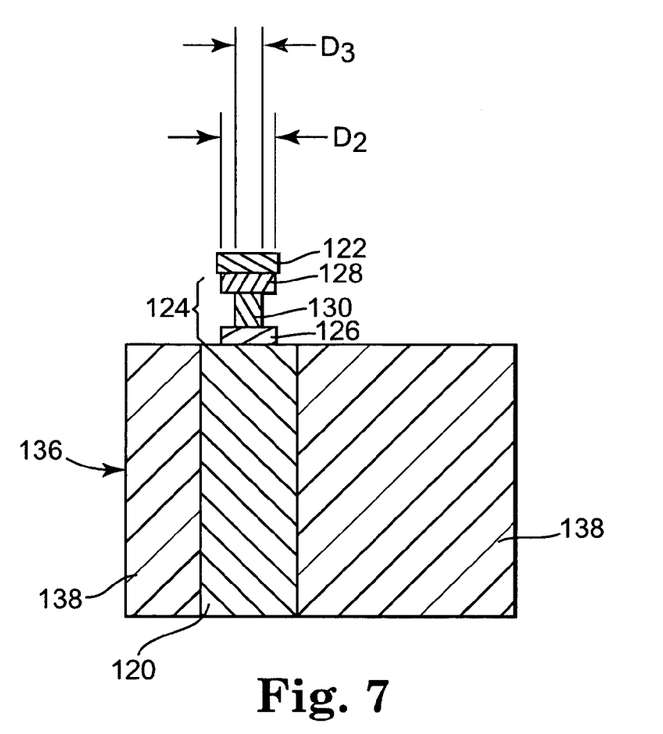
FIG. 7 illustrates a cross-sectional view of a stack of phase change materials after a wet pull-back etch according to one embodiment of the present invention.

FIG. 7 illustrates a cross-sectional view of stack 124 after an undercut etch according to one embodiment of the present invention. In one embodiment, the undercut etch is a wet chemical pull-back etch that pull-back etches hard mask layer 148 (FIG. 6) and undercut etches third phase change material 130. In one embodiment, the undercut etch illustrated in FIG. 7 is completed in the gas phase in a vapor etch reactor, or alternatively, the undercut etch is a plasma dry etch. In any regard, the third phase change material 130 is selected to have an etch rate relative to the etch chemistry employed that is greater than an etch rate of either the first phase change material 126 or the second phase change material 128 relative to the same etch chemistry. In this manner, width D3 of the third phase change material 130 is less than width D2 of second phase change material 128 after the undercut etch is completed.

FIG. 8 illustrates a cross-sectional view of an isolation material 132 deposited around stack 124 to isolate memory cell 106 according to one embodiment of the present invention. In one embodiment, isolation material 132 is a low-k isolation material. Suitable isolation materials include silicon dioxide, silicon nitride, porous oxide, or other suitable oxide isolation materials. In one embodiment, isolation material 132 is deposited by a high density plasma chemical vapor deposition (HDP CVD) process. In one embodiment, a radio frequency biased HDP CVD process is employed to deposit a silicon dioxide isolation material 132 along a high aspect feature, such as stack 124.

Figure 9:
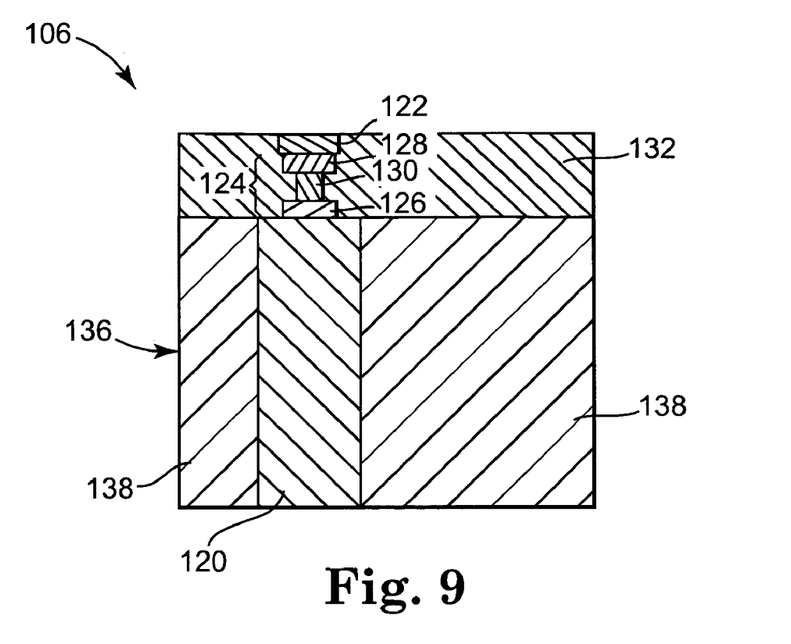
FIG. 9 illustrates a planarized isolation material of a memory cell according to one embodiment of the present invention.

FIG. 9 illustrates a memory cell 106 including a planarized isolation layer 132 according to one embodiment of the present invention. In one embodiment, isolation layer 132 is planarized in a chemical mechanical polishing (CMP) process, although other suitable planarization processes are acceptable. In one embodiment, the CMP process stops within top electrode 122 where the CMP process includes a selectivity against the top electrode metallization.

Figure 10:
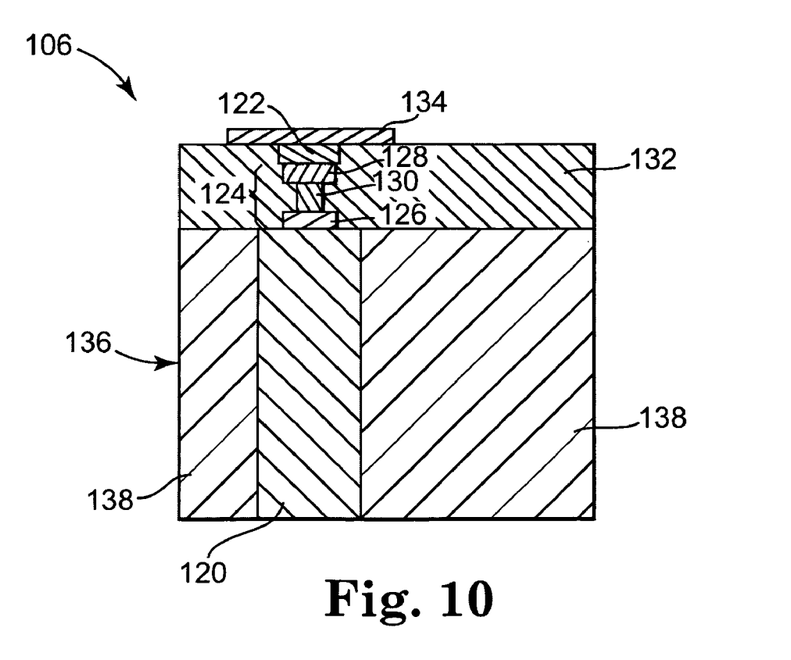
FIG. 10 illustrates a cross-sectional view of memory cell having a stack of phase change materials and a plug landing pad according to one embodiment of the present invention.

FIG. 10 illustrates formation of a plug landing pad 134 on memory cell 106 according to one embodiment of the present invention. In one embodiment, plug landing pad 134 includes a blanket metal deposition of, for example, titanium nitride (TiN), followed by lithographic and etch processes. In one embodiment, plug landing pad 134 includes a metallization of Al/Cu using a dual damascene process. In another embodiment, plug landing pad 134 is a tungsten pad deposited in a plug formation process.

FIGS. 2-10 illustrate exemplary embodiments suited for fabrication of memory cell 106. Memory cell 106 includes first electrode 120, an opposing second electrode 122, and stack 124 of phase change material extending between first electrode 120 and second electrode 122. Plug landing pad 134 is provided to enable electrical connectivity of memory cell 106 to distribution circuit 104 (FIG. 1). A width D3 of third phase change material 130 is narrower than other layers of stack 124 and defines an active region 140 (FIG. 2), and memory cell 106 is a low power cell that locates large memory changing temperature gradients away from electrodes 120, 122 to provide memory cell 106 with improved lifetime and endurance.

Figure 11:
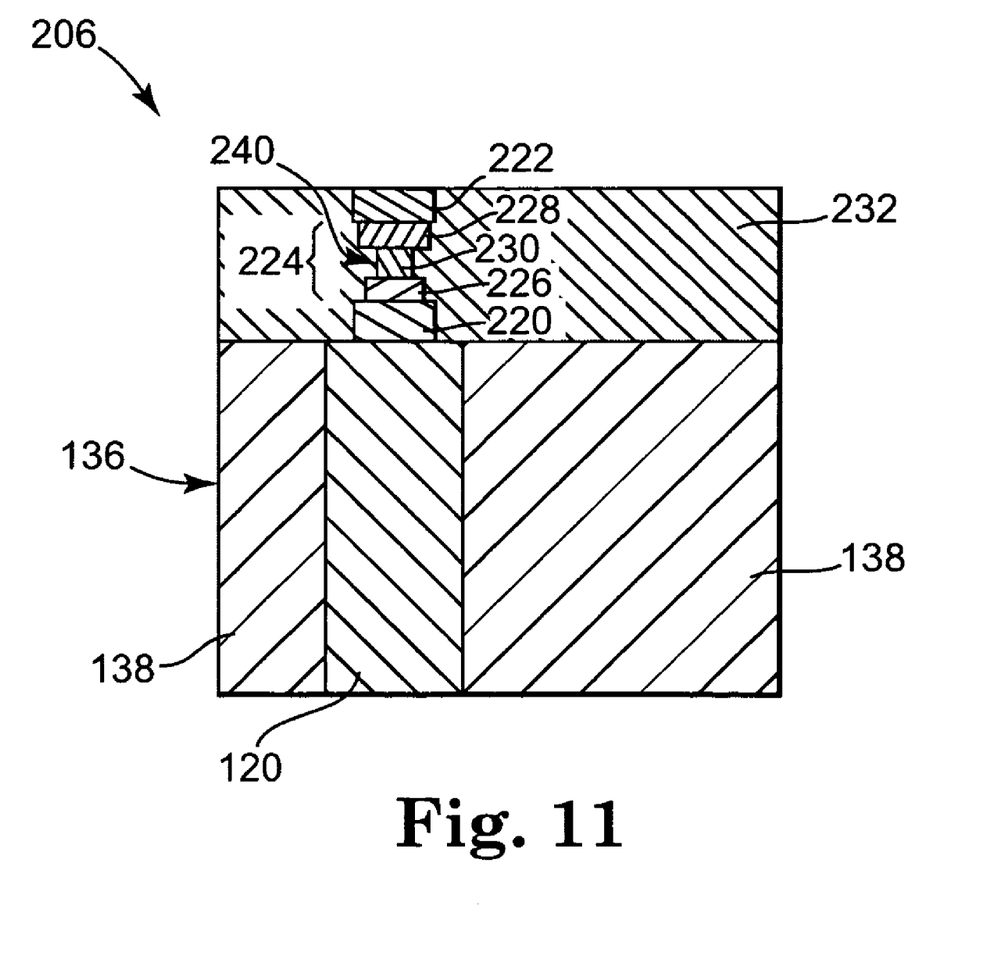
FIG. 11 illustrates a cross-sectional view of a memory cell according to another embodiment of the present invention.

FIG. 11 illustrates another embodiment of a low power memory cell having an active region that locates large memory changing temperature gradients away from the opposing electrodes to provide improved memory cell lifetime and endurance. In general, a stack of phase change material is provided between opposing electrodes that defines an active region width that is less than a width of either of a first phase change material and a second phase change material of the stack.

FIG. 11 illustrates a cross-sectional view of a memory cell 206 according to another embodiment of the present invention. In one embodiment, memory cell 206 is fabricated onto plug 120 provided in a pre-processed wafer 136 and includes a dedicated electrode 220 in contact with plug 120.

Memory cell 206 includes first electrode 220, an opposing second electrode 222, and a stack 224 of phase change materials extending between first electrode 220 and second electrode 222. In one embodiment, stack 224 of phase change materials includes a first phase change material 226 contacting first electrode 220, a second phase change material 228 contacting second electrode 222, and a third phase change material 230 between first phase change material 226 and second phase change material 228. In another embodiment, stack 224 includes a continuous gradient of phase change materials, as best illustrated in FIG. 14.

Isolation material 232 surrounds stack 224 of phase change material and electrodes 220, 222. In one embodiment, isolation material 232 is an insulation dielectric and includes, for example, silicon dioxide ($SiO_2$), a porous oxide insulator, a low-k insulation material, or other suitable insulation materials. In one embodiment, a pad and other upper layers (not shown), in addition to lower layers (not shown), are subsequently coupled to memory cell 206 to enable electrical connectivity of memory cell 206 to distribution circuit 104 (FIG. 1), for example.

In one embodiment, first phase change material 226 is different from second phase change material 228, and second phase change material 228 is different from third phase change material 230. In another embodiment, first phase change material 226 is substantially the same as second phase change material 228, and third phase change material 230 is different than first phase change material 226.

Figure 12:
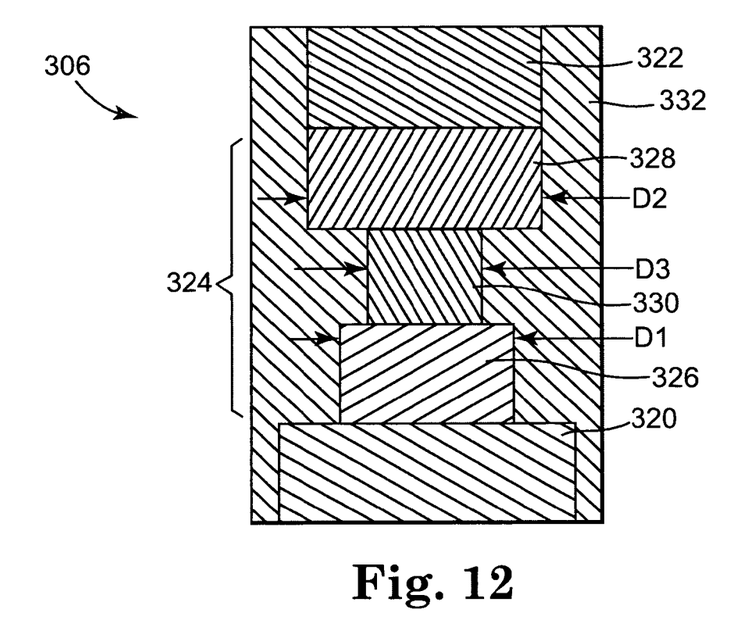
FIG. 12 illustrates a cross-sectional view of a stack of phase change materials in a memory cell according to another embodiment of the present invention.
Figure 13:
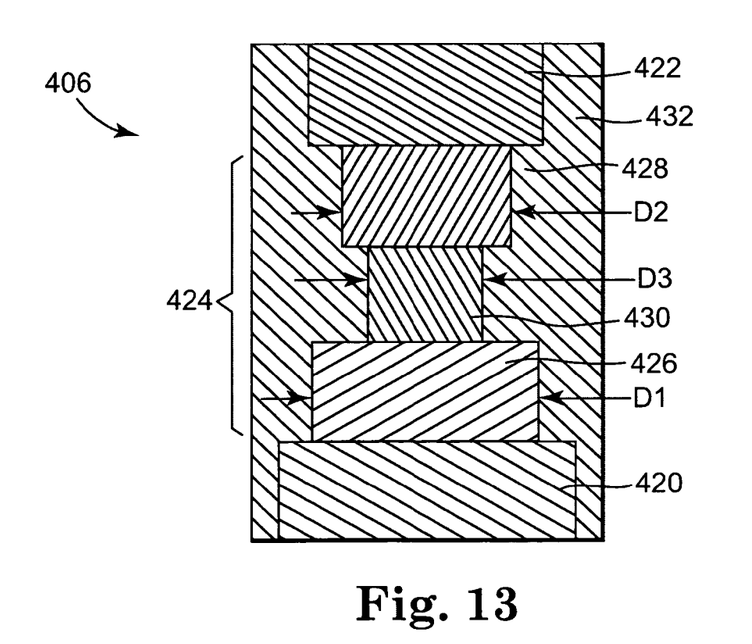
FIG. 13 illustrates a cross-sectional view of a stack of phase change materials in a memory cell according to another embodiment of the present invention.
Figure 14:
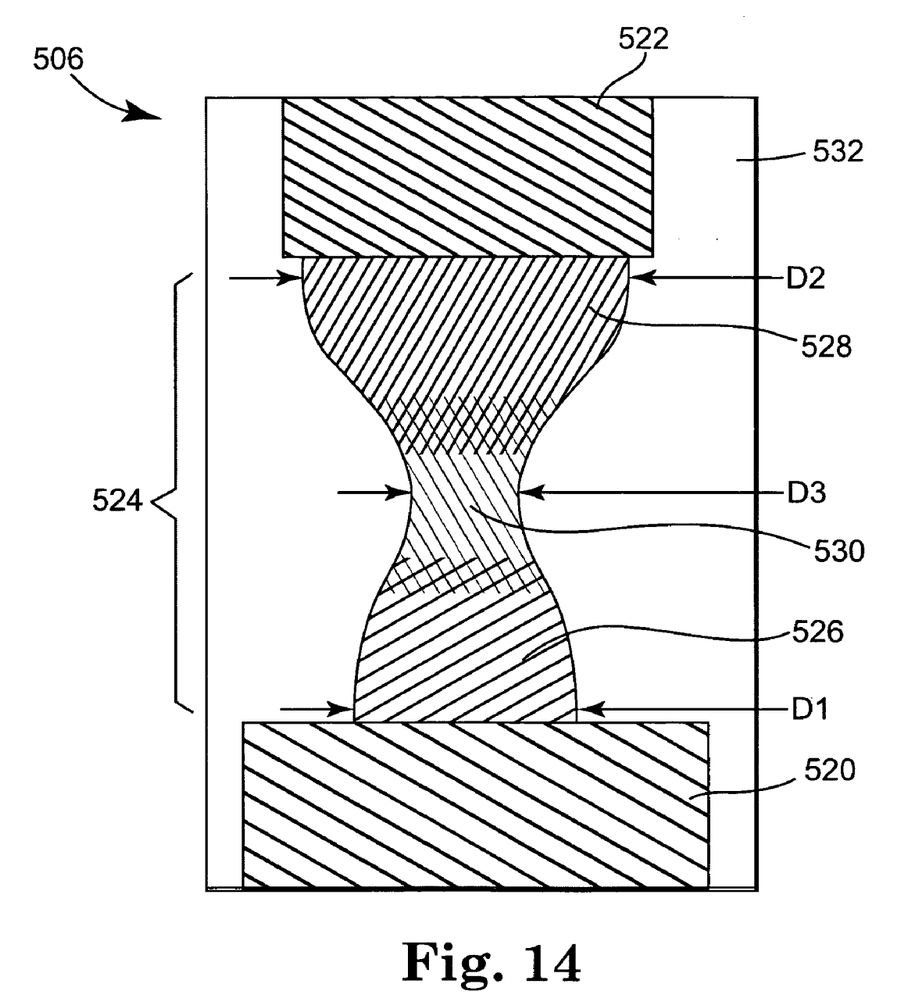
FIG. 14 illustrates a cross-sectional view of a gradient of phase change materials in a memory cell according to one embodiment of the present invention.

FIGS. 12-14 illustrate other embodiments of a low power memory cell having an active region that locates large memory changing temperature gradients away from the opposing electrodes to provide improved memory cell lifetime and endurance. In general, a stack of phase change material is provided between opposing electrodes that defines an active region width that is less than a width of either of a first phase change material and a second phase change material of the stack.

FIG. 12 illustrates a cross-sectional view of a stack 324 of phase change materials in a memory cell 306 according to another embodiment of the present invention. Memory cell 306 includes first electrode 320, an opposing second electrode 322, and a stack 324 of phase change materials extending between first electrode 320 and second electrode 322.

In one embodiment, stack 324 of phase change materials includes a first phase change material 326 contacting first electrode 320, a second phase change material 328 contacting second electrode 322, and a third phase change material 330 between first phase change material 326 and second phase change material 328. Isolation material 332 surrounds stack 324 of phase change material and electrodes 320, 322.

In one embodiment, first phase change material 326 is different from second phase change material 328, and second phase change material 328 is different from third phase change material 330, although other suitable combinations are acceptable.

In one embodiment, as best illustrated in FIG. 12, first phase change material 326 and third phase change material 330 each define an etch rate relative to a reactive etch chemistry that is greater than an etch rate of second phase change material 328 relative to the same reactive etch chemistry. As a consequence, during a pull-back etch or wet reactive etch, a width D1 of first phase change material 326 and a width D3 of third phase change material 330 are each less than a width D2 of second phase change material 328. Since width D3 of third phase change material 330 is the narrowest width within stack 324, less power is consumed in changing a memory state in memory cell 306, and large memory changing temperature gradients are located away from the opposing electrodes 320, 322.

FIG. 13 illustrates a cross-sectional view of a stack 424 of phase change materials in a memory cell 406 according to another embodiment of the present invention. Memory cell 406 includes first electrode 420, an opposing second electrode 422, and a stack 424 of phase change materials extending between first electrode 420 and second electrode 422.

In one embodiment, stack 424 of phase change materials includes a first phase change material 426 contacting first electrode 420, a second phase change material 428 contacting second electrode 422, and a third phase change material 430 between first phase change material 426 and second phase change material 428. Isolation material 432 surrounds stack 424 of phase change material and electrodes 420, 422.

In one embodiment, first phase change material 426 is different from second phase change material 428, and second phase change material 428 is different from third phase change material 430, although other suitable combinations are acceptable.

In one embodiment, second phase change material 428 and third phase change material 330 each define an etch rate relative to a reactive etch chemistry that is greater than an etch rate of first phase change material 426 relative to the same reactive etch chemistry. As a consequence, during a pull-back etch or wet reactive etch, a width D2 of second phase change material 428 and a width D3 of third phase change material 430 are each less than a width D1 of first phase change material 426. Since width D3 of third phase change material 430 is the narrowest width within stack 424, less power is consumed in changing a memory state in memory cell 406, and large memory changing temperature gradients are located away from the opposing electrodes 420, 422.

FIG. 14 illustrates a cross-sectional view of a gradient 524 of phase change materials in a memory cell 506 according to one embodiment of the present invention. Memory cell 506 includes first electrode 520, an opposing second electrode 522, and a stack 524 of phase change materials extending between first electrode 520 and second electrode 522.

In one embodiment, stack 524 of phase change materials includes a first phase change material 526 contacting first electrode 520, a second phase change material 528 contacting second electrode 522, and a third phase change material 530 between first phase change material 526 and second phase change material 528. Isolation material 532 surrounds stack 524 of phase change material and electrodes 520, 522.

In one embodiment, stack 524 of phase change materials defines a continuous pillar of phase change material that itself defines a gradient of electrical and material properties. In particular, a central portion of stack 524 includes third phase change material 530, and it is desired that third phase change material 530 be selected and deposited to define an etch rate relative to a reactive etch chemistry that is greater than an etch rate of either of first phase change material 526 and second phase change material 528 relative to the same reactive etch chemistry. In another embodiment, it is desired that third phase change material 530 defines an electrical resistivity that is greater than an electrical resistivity of either of first phase change material 526 and second phase change material 528.

In one embodiment, first phase change material 526 and third phase change material 530 each define an etch rate relative to a reactive etch chemistry that is greater than an etch rate of second phase change material 528 relative to the same reactive etch chemistry. As a consequence, during a pull-back etch or wet reactive etch, a width D1 of first phase change material 526 and a width D3 of third phase change material 530 are each less than a width D2 of second phase change material 528. Since width D3 of third phase change material 530 is the narrowest width within stack 524, less power is consumed in changing a memory state in memory cell 506, and large memory changing temperature gradients are located away from the opposing electrodes 520, 522.

Various embodiments have been described of a low power memory cell having an active region that locates large memory changing temperature gradients away from the opposing electrodes to provide improved memory cell lifetime and endurance. In general, a stack of phase change material is provided between opposing electrodes that defines an active region width that is less than a width of either of a first phase change material and a second phase change material of the stack. The phase change memory cells including the stack of phase change material draw less power in changing memory states in the memory cells, which enables the use of smaller selection devices, and thus reduces an overall size for memory devices. The low power phase change memory cells include memory elements that have been fabricated by a controlled undercut etching of different phase change materials within the memory element.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a memory cell comprising:
    a first electrode and an opposing second electrode; and
    a memory stack comprising a first layer of thermal isolation material in contact with the first electrode, a second layer of thermal isolation material in contact with the second electrode, and a phase change material between the first and second layers of thermal isolation material, the phase change material comprising a material different from the first and second layers of thermal isolation material;
    wherein the phase change material defines an active region width that is less than a width of either of the first layer of thermal isolation material and the second layer of thermal isolation material.

2. The integrated circuit of claim 1, wherein the phase change material defines an etch rate at a given reactive etch chemistry that is greater than an etch rate of either of the first and second layers of thermal isolation material at the given reactive etch chemistry.

3. The integrated circuit of claim 1, wherein the active region width is between 5-50 nm.

4. The integrated circuit of claim 1, wherein the first layer of thermal isolation material and the second layer of thermal isolation material comprise substantially the same material.

5. The integrated circuit of claim 1, wherein the phase change material defines an electrical resistivity that is greater than an electrical resistivity of either of the first layer of thermal isolation material and the second layer of thermal isolation material.

* * * * *